(12) United States Patent
Stopa et al.

(10) Patent No.: US 11,271,538 B2
(45) Date of Patent: Mar. 8, 2022

(54) ULTRA HIGH FREQUENCY AND TUNABLE CARBON NANOTUBE RESONATOR

(71) Applicant: Konica Minolta Business Solutions U.S.A., Inc., San Mateo, CA (US)

(72) Inventors: Michael Stopa, San Mateo, CA (US); Jun Amano, Hillsborough, CA (US); Karsten Bruening, Portola Valley, CA (US)

(73) Assignee: Konica Minolta Business Solutions U.S.A., Inc., San Mateo, CA (US)

(*) Notice: Subject to any disclaimer, the term of this patent is extended or adjusted under 35 U.S.C. 154(b) by 790 days.

(21) Appl. No.: 16/147,355

(22) Filed: Sep. 28, 2018

(65) Prior Publication Data

US 2020/0106415 A1  Apr. 2, 2020

(51) Int. Cl.
| | |
|---|---|
| H03H 9/02 | (2006.01) |
| C01B 32/159 | (2017.01) |
| H03H 9/10 | (2006.01) |
| H03H 3/02 | (2006.01) |
| B82Y 40/00 | (2011.01) |

(52) U.S. Cl.
CPC ......... *H03H 9/02015* (2013.01); *B82Y 40/00* (2013.01); *C01B 32/159* (2017.08); *H03H 3/02* (2013.01); *H03H 9/1021* (2013.01); *H03H 2003/022* (2013.01)

(58) Field of Classification Search
CPC ............ H03H 9/02015; H03H 9/1021; H03H 2003/022
See application file for complete search history.

(56) References Cited

U.S. PATENT DOCUMENTS

| | | | |
|---|---|---|---|
| 2004/0022943 A1* | 2/2004 | Schlaf ................... | B82Y 40/00 427/249.1 |
| 2009/0309676 A1* | 12/2009 | Zettl .................... | H03H 9/2463 333/186 |
| 2012/0186635 A1* | 7/2012 | Eastman ................ | B82Y 20/00 136/252 |
| 2018/0106689 A1* | 4/2018 | Tian .................... | H01L 41/0478 |
| 2019/0143558 A1* | 5/2019 | Hunt .................... | B29C 64/209 204/192.33 |

* cited by examiner

*Primary Examiner* — Bryan P Gordon
(74) *Attorney, Agent, or Firm* — Osha Bergman Watanabe & Burton LLP

(57) ABSTRACT

A carbon nanotube (CNT) resonator includes: a first CNT having a first end and a second end both fixed to a substrate; and a second CNT having a first end fixed to the substrate. The second CNT creates a Van der Waals (VdW) bond with the first CNT where the second CNT overlaps the first CNT. A length of the VdW bond along a distance between the first and the second CNTs oscillates based on a DC voltage applied between the first end of the first CNT and the first end of the second CNT. An electrical current passing through the first and the second CNTs using the VdW bond oscillates based on the oscillation of the length of the VdW bond.

8 Claims, 7 Drawing Sheets

ULTRA HIGH FREQUENCY AND TUNABLE CARBON NANOTUBE RESONATOR

BACKGROUND

High frequency resonators are used in a wide variety of electronic devices such as cell phones, processors, radio receivers and transmitters, etc. One common high-frequency resonator is the film bulk acoustic resonator (FBAR), which is bulky and oscillates at frequencies limited to about 10 GHz or lower. FBARs are made from films of piezoelectric materials that are tens of microns thick and have surface areas of hundreds of square microns. To reduce the size of electronic devices and increase the speed of data communication and data processing, there is a demand for smaller resonators that oscillate at higher frequencies.

SUMMARY

In general, in one aspect, the invention relates to a method of manufacturing a carbon nanotube (CNT) resonator. The method includes: fixing a first end and a second end of a first CNT to a substrate; fixing a first end of a second CNT to the substrate; forming a Van der Waals (VdW) bond between the first and the second CNTs where the second CNT overlaps the first CNT; connecting the first end of the first CNT to a first terminal portion; and connecting the first end of the second CNT to a second terminal portion.

In general, in one aspect, the invention relates to a CNT resonator that includes: a first CNT having a first end and a second end both fixed to a substrate; and a second CNT having a first end fixed to the substrate. The second CNT creates a VdW bond with the first CNT where the second CNT overlaps the first CNT. A length of the VdW bond along a distance between the first and the second CNTs oscillates based on a DC voltage applied between the first end of the first CNT and the first end of the second CNT. An electrical current passing through the first and the second CNTs using the VdW bond oscillates based on the oscillation of the length of the VdW bond.

Other aspects of the invention will be apparent from the following description and the appended claims.

DETAILED DESCRIPTION

Figure 1A:
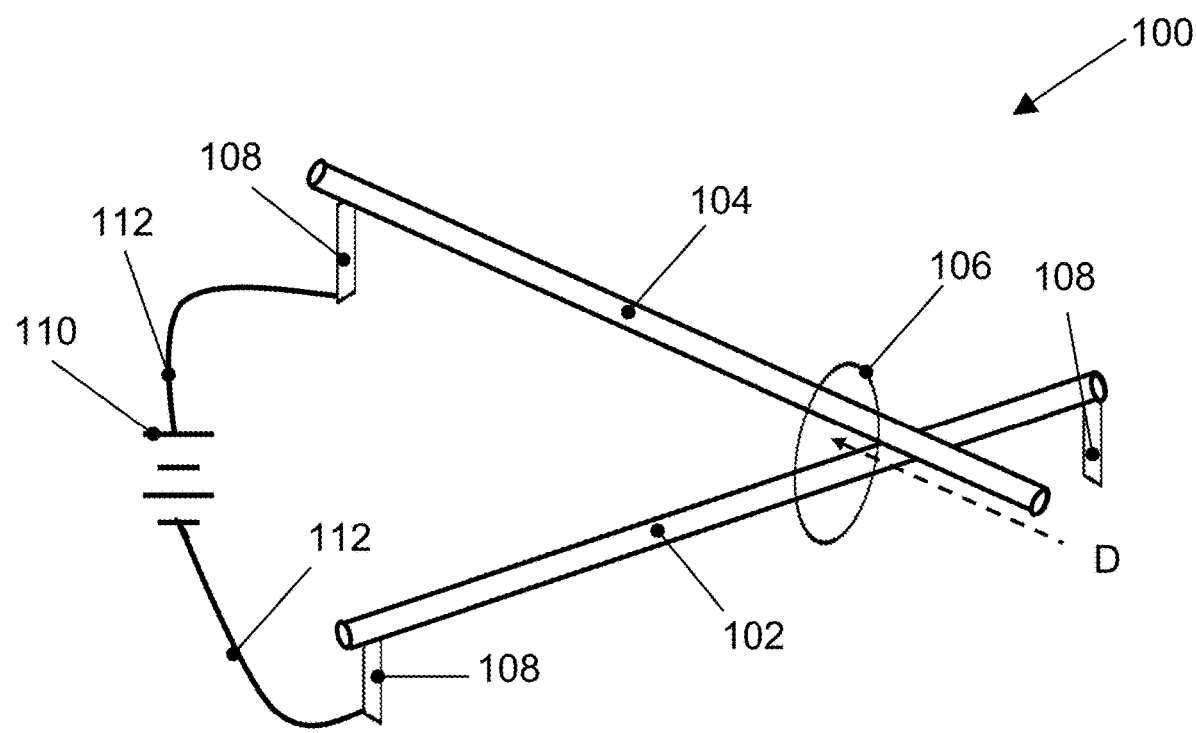
FIG. 1A shows a carbon nanotube (CNT) resonator in accordance with one or more embodiments of the invention.

Specific embodiments of the invention will now be described in detail with reference to the accompanying figures. Like elements in the various figures are denoted by like reference numerals for consistency.

In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

In general, embodiments of the invention provide a carbon nanotube (CNT) resonator and a method for manufacturing the CNT resonator.

Advantageously, the CNT resonator in accordance with one or more embodiments of the invention is made of CNTs that have nanoscale dimensions, making it significantly smaller than conventional resonators such as FBARs. Moreover, while having nanoscale dimensions, the CNT resonator in accordance with one or more embodiments of the invention provides high mechanical strength due to the high mechanical strength of CNTs.

FIG. 1A shows a CNT resonator (100) in accordance with one or more embodiments of the invention. The CNT resonator (100) comprises a first CNT (102) and a second CNT (104) disposed on a substrate. The second CNT (104) is disposed on the substrate such that the second CNT (104) overlaps the first CNT (102). The first and the second CNTs (102, 104) may be situated in air or under vacuum.

In the example shown in FIG. 1A, the first and the second CNTs (102, 104) are disposed to be straight on the substrate. However, the first and the second CNTs (102, 104) may be disposed to have other shapes (e.g., curve, loop, etc.).

In one or more embodiments, the first and the second CNTs (102, 104) may be single-wall CNTs and may be metallic. Alternatively, in one or more embodiments, the first and the second CNTs (102, 104) may be semiconducting and may be doped to have conductivities based on the preferred design or functionality of the CNT resonator (100).

In the example shown in FIG. 1A, both ends of the first CNT (102) are each fixed to the substrate via a fixing means (108). Further, one end of the second CNT (104) (i.e., a first end of the second CNT (104)) is fixed to the substrate via a fixing means (108), while the other end of the second CNT (104) (i.e., the second end of the second CNT (104)) is not. According to this configuration, the second CNT (104) functions as a cantilever. However, in other embodiments, both ends of the second CNT may be fixed to the substrate.

In one or more embodiments, at least one of the fixing means (108) is a layer of a material deposited on top of one end of the first CNT (102) or the first end of the second CNT (104) and fixes the end to another layer of the same material or a different material underneath the end (e.g., the substrate, one or more layers between the substrate and the ends, etc.).

In one or more embodiments, the layer of the material on top of the fixed end (top layer) or the layer of the material underneath the fixed end (bottom layer) may be conductive. Further, the top layer or the bottom layer may be deposited via electron-beam evaporation or sputtering. Other methods may also be used to fix the ends of the first CNT (102) and the first end of the second CNT (104) based on the preferred design or functionality of the CNT resonator (100).

In one or more embodiments, the conductive top layer or the conductive bottom layer may be titanium nitride, gold, or rubidium. However, other materials may be chosen based on the preferred design or functionality of the CNT resonator (100).

In the example shown in FIG. 1A, the first CNT (102) is elevated from the substrate. In one or more embodiments, each end of the first CNT (102) may be sandwiched between the top layer and the bottom layer such that the first CNT (102) does not directly contact the substrate. Likewise, the second CNT (104) may also be elevated from the substrate.

Alternatively, the first CNT (102) or the second CNT (104) may be disposed directly on the substrate. In one or more embodiments, if a portion of the second CNT (104) between the first end of the second CNT (104) and the overlapping region (106) is disposed directly on a region of the substrate, that region of the substrate is electrically isolated from the second CNT (104). For example, at least that region of the substrate may be an insulator.

In the example shown in FIG. 1A, a terminal of a DC power supply (110) is connected to at least one end of the first CNT (102) via a conductive wire (112), while the opposite terminal of the DC power supply (110) is connected to the first end of the second CNT (104) via another conductive wire (112).

In one or more embodiments, in a region where the second CNT (104) overlaps the first CNT (102) (i.e., overlapping region (106)), the second CNT (104) forms a Van der Waals (VdW) bond with the first CNT (102).

Figure 1B:
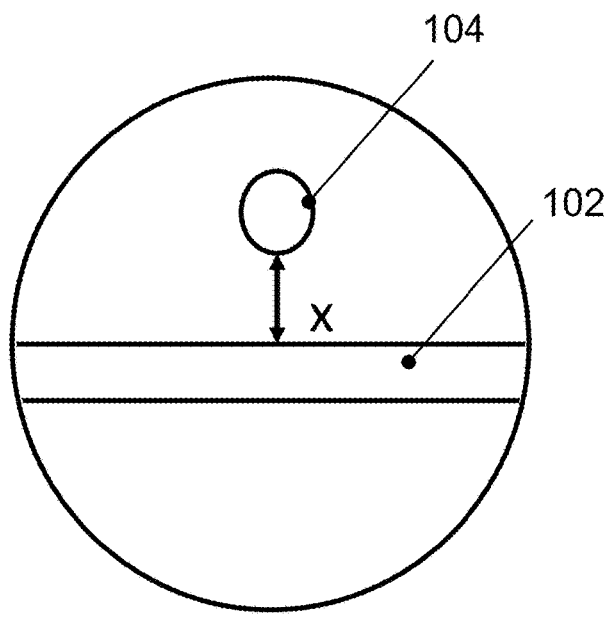
FIG. 1B shows a close-up view of a Van der Waals (VdW) bond in the CNT resonator shown in FIG. 1 A.

FIG. 1B shows a close-up view of the overlapping region (106) shown in FIG. 1A. "x" represents a "bonding length" of the VdW bond between the first and the second CNTs (102, 104).

Figure 2:
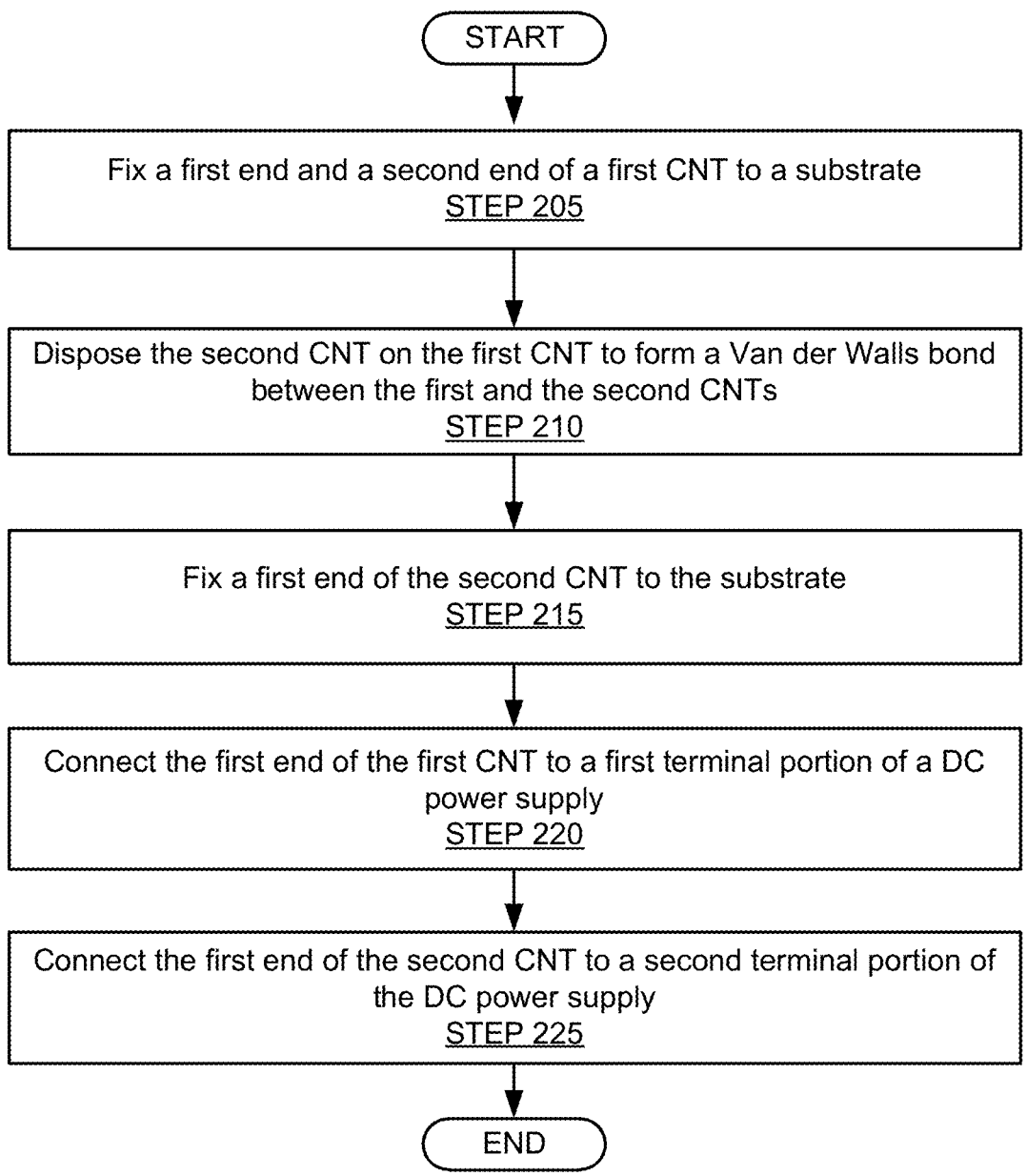
FIG. 2 shows a flowchart of a manufacturing process of the CNT resonator in accordance with one or more embodiments of the invention.

FIG. 2 shows a flowchart in accordance with one or more embodiments depicting a method for manufacturing the CNT resonator. In one or more embodiments, one or more of the steps shown in FIG. 2 may be omitted, repeated, and/or performed in a different order than the order shown in FIG. 2. Accordingly, the scope of the invention is not limited to the specific arrangement of steps shown in FIG. 2.

In STEP 205, a first CNT is disposed on a substrate and both ends of the first CNT (i.e., a first end and a second end of the first CNT) are fixed to the substrate. For example, as discussed above, each end of the first CNT (102) may be fixed to the substrate by depositing the top layer on the end of the first CNT (102).

In STEP 210, a second CNT is disposed on the substrate so as to overlap the first CNT and form a VdW bond with the first CNT. For example, as shown in FIGS. 1A-1B, the second CNT (104) is disposed on the substrate, overlaps the first CNT (102), and forms the VdW bond with the first CNT (102) in the overlapping region (106).

In STEP 215, one end of the second CNT (i.e., a first end of the second CNT) is fixed to the substrate. For example, the same method used in STEP 205 to fix the ends of the first CNT can be used to fix the first end of the second CNT.

In STEP 220, at least one end of the first CNT is connected to a first terminal portion of a DC power supply. Alternatively, in STEP 225, the first end of the second CNT is connected to the opposite terminal portion of the DC power supply. For example, as shown in FIG. 1A, one end of the first CNT (102) and the first end of the second CNT (104) are connected to the terminals of the DC power supply (110) via the conductive wires (112).

Figure 3:
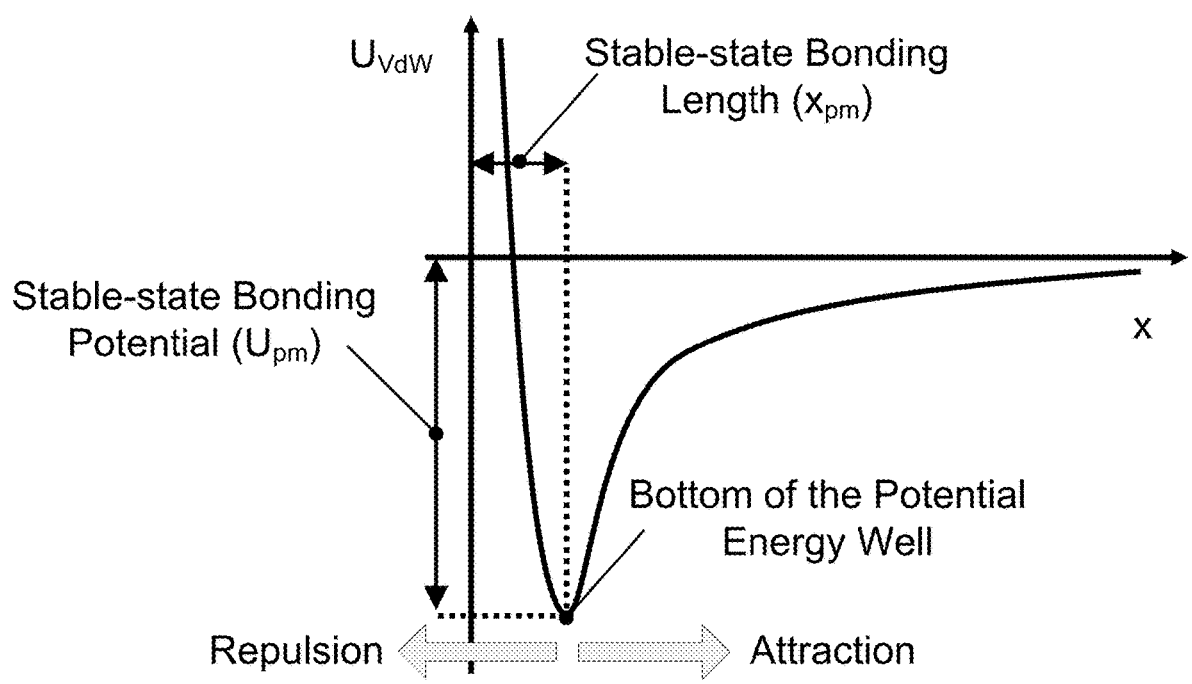
FIG. 3 shows a graph of potential energy of the VdW bond shown in FIG. 1B.
Figure 4:
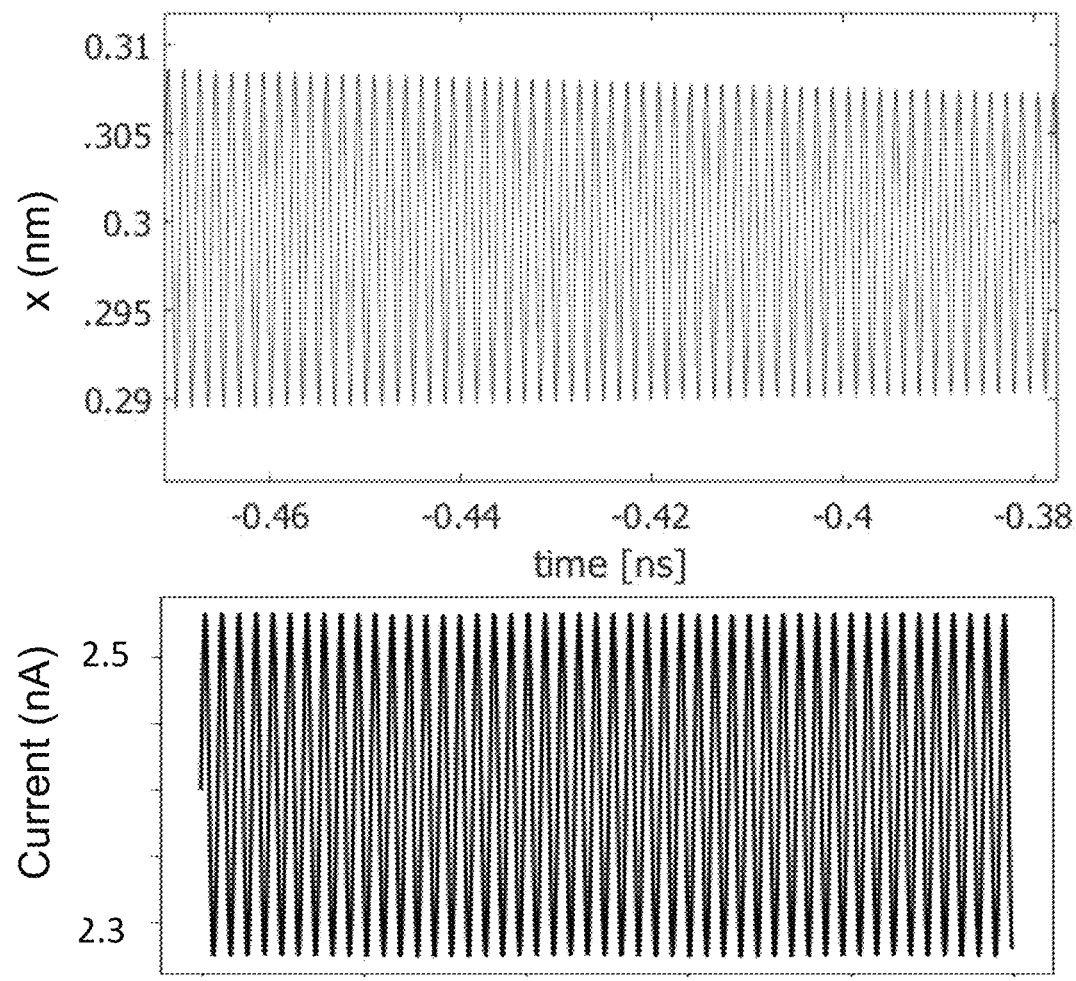
FIG. 4 shows an implementation example in accordance with one or more embodiments of the invention.
Figure 5:
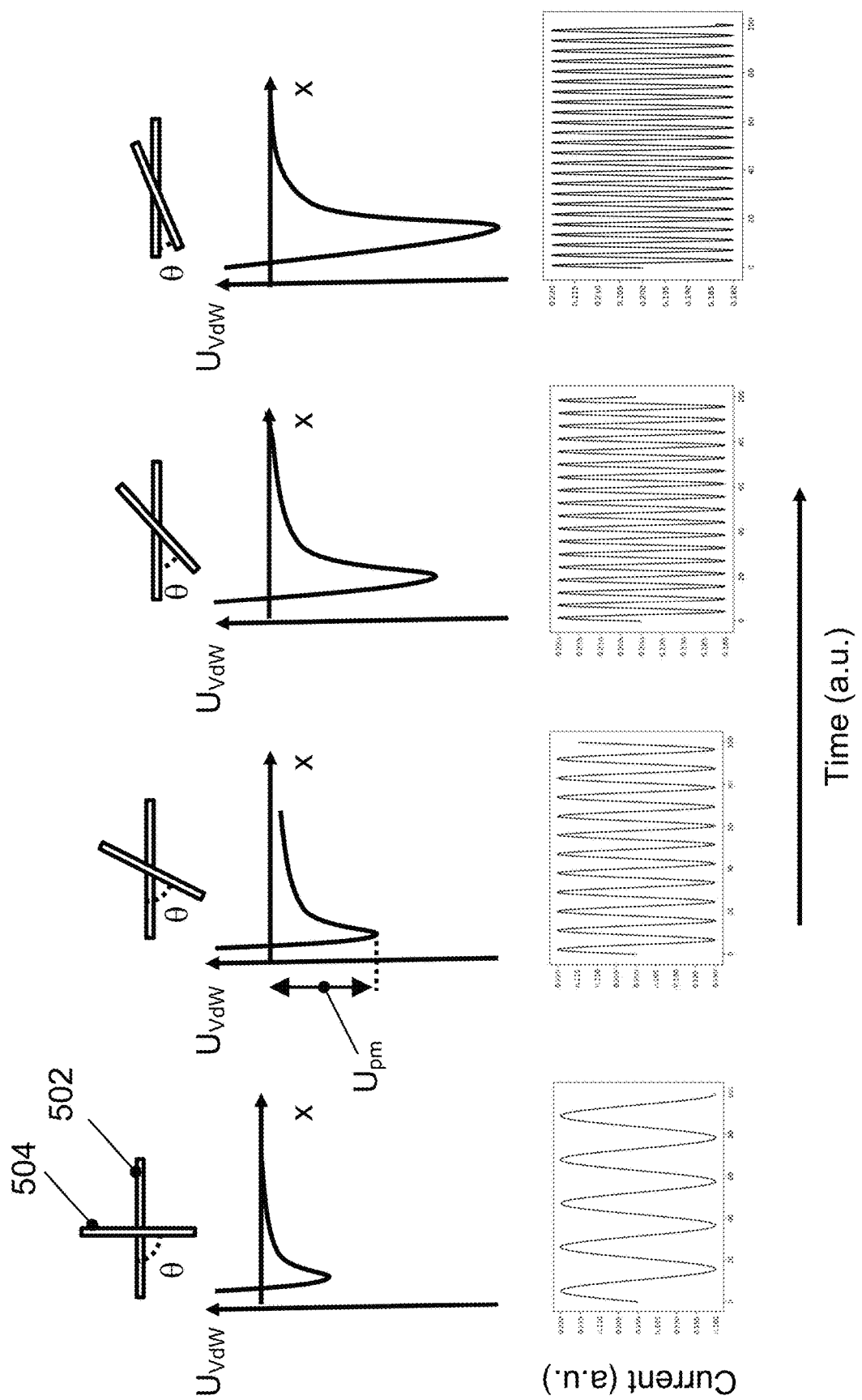
FIG. 5 shows an implementation example in accordance with one or more embodiments of the invention.

FIGS. 3-5 show implementation examples of the CNT resonator in accordance with one or more embodiments. These demonstrate how the CNT resonator creates ultra-high frequency oscillations of electrical current.

FIG. 3 shows the relationship between a potential energy of the VdW bond "$U_{VdW}$" and x in accordance with one or more embodiments. This relationship is described by the Lennard-Jones equation (1) below that formulates a potential energy of an interaction between two induced dipoles (i.e., induced dipole-induced dipole interaction).

$$U_{VdW}(x) = -\frac{A}{x^6} + \frac{B}{x^{12}} \quad (1)$$

In equation (1), A and B are constants.

As shown in FIG. 3, in a stable state, x is where $U_{VdW}$ is at the bottom of the potential energy well. $U_{VdW}$ at the bottom of the potential energy well is referred to as stable-state bonding potential "$U_{pm}$," and x at $U_{pm}$ is referred to as stable-state bonding length "$x_{pm}$." For example, in one or more embodiments, $x_{pm}$ between the first and the second CNTs (102, 104) shown in FIGS. 1A-1B may be about 0.3 nm. When x becomes smaller than $x_{pm}$, a repulsive force pushes the first and the second CNTs (102, 104) away from each other. On the other hand, when x becomes larger than $x_{pm}$, an attracting force pulls the first and the second CNTs (102, 104) toward each other.

Upon application of a DC voltage on the VdW bond, x moves away from $x_{pm}$ and the repulsive and attracting forces described above cause oscillation of x around $x_{pm}$. FIG. 4 shows an oscillation example of x around $x_{pm}$ upon application of the DC voltage between the first and the second CNTs (102, 104) shown in FIGS. 1A-1B. Upon application of the DC voltage, an electrical current passes through the first and the second CNTs (102, 104) using the VdW bond therebetween. Because the VdW bond is a tunneling junction, the value of the electrical current depends exponentially on x. While x oscillates around $x_{pm}$, the electrical current is high if x is low and the electrical current is low if x is high. Accordingly, the electrical current oscillates with the same frequency as the oscillation frequency of x, as shown in FIG. 4.

FIG. 5 shows a method for tuning the oscillation frequency of the electrical current in accordance with one or more embodiments. By adjusting the angle θ between the first CNT (502) and the second CNT (504), as shown in FIG. 5, $U_{pm}$ between the first and the second CNTs (502, 504) can be adjusted. When θ is closer to 0°, $U_{pm}$ is higher than when θ is closer to 90. When $U_{pm}$ is higher, the VdW bond is stronger and there is more force to bring the VdW bond to the bottom of the potential energy well. Thus, when θ is closer to 0°, the oscillation frequency of the electrical current, which is the same as the oscillation frequency of x, is higher than the oscillation frequency of the electrical current when θ is closer to 90°. Accordingly, the oscillation frequency of the electrical current can be tuned by adjusting θ.

Figure 6:
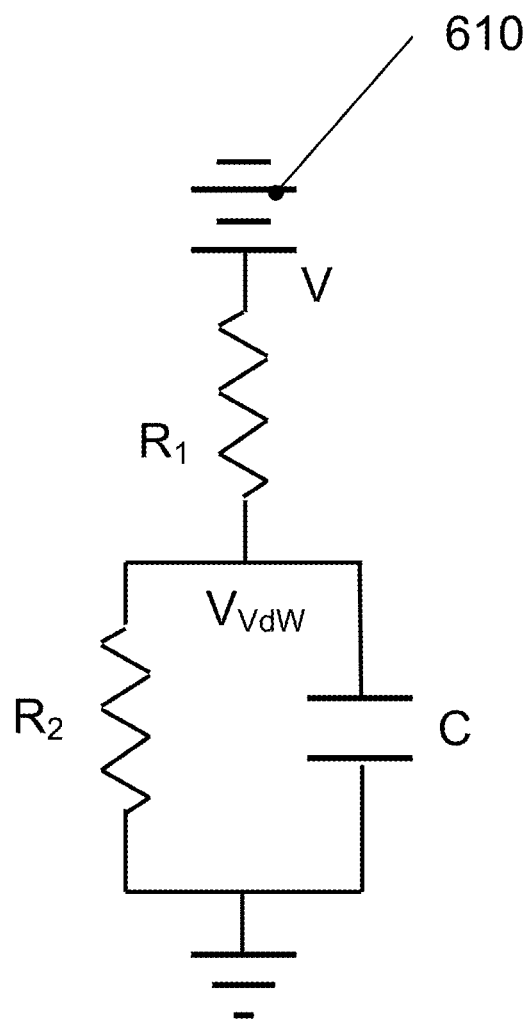
FIG. 6 shows a simplified circuit model of the CNT resonator shown in FIG. 1A.

FIG. 6 shows a simplified circuit model of the CNT resonator (100) shown in FIG. 1A in accordance with one or more embodiments. The VdW bond is modeled with a capacitor "C" paralleled with a resistor "$R_2$." The values of C and $R_2$ depend on x. Other resistors in the CNT resonator (100) (e.g., resistance of the first and the second CNTs (102, 104)) are shown as "$R_1$." When the DC power supply (610) applies a DC voltage between the first and the second CNTs (102, 104), a voltage "$V_{VdW}$" will be applied to the VdW bond.

Figure 7:
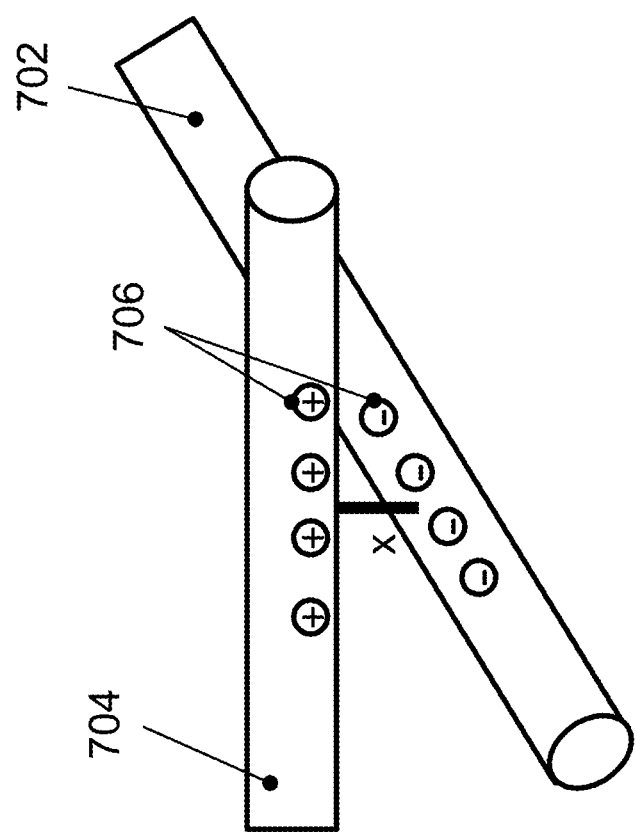
FIG. 7 shows the VdW bond of the CNT resonator shown in FIG. 1 A.

According to one or more embodiments, because of $V_{VdW}$, electrostatic charges (706) "Q" accumulate around the VdW bond, as shown in FIG. 7. Based on Kirchhoff's circuit rules, Q can be calculated by equation (2) below.

$$\dot{Q} = \frac{V}{R_1} - \frac{Q}{R_{eff}C} \qquad (2)$$

$$R_2(x) = R_0 \text{ for } x < x_{pm}$$
$$\qquad = R_0 \exp(\kappa(x - x_0)) \text{ for } x > x_{pm} \qquad (3)$$

$$C(x) = \frac{\alpha_C}{x} \qquad (4)$$

$$R_{eff} = \frac{R_1 R_2}{R_1 + R_2} \qquad (5)$$

where:
V is the bias voltage of the DC power supply (610); and $R_0$, $\kappa$, and $\alpha_c$ are constants. $\kappa$ can be estimated via a Wentzel-Kramers-Brillouin (WKB) approximation across VdW tunneling barrier, which has a barrier height given by an ionization potential of carbon (~11 eV). According to this approximation, $\kappa$ may be between 4 to 5.4 nm$^{-1}$.

According to one or more embodiments, Q creates an attracting electrostatic force between the first CNT (702) and the second CNT (704). This attracting force pulls the first and the second CNTs (702, 704) closer to each other (i.e., x becomes smaller than $x_{pm}$). Thus, the electrical current increases, and Q and the electrostatic attracting force decrease. However, as shown in FIG. 3, when x becomes smaller than $x_{pm}$, the induced dipole-induced dipole repulsive force increases and pushes the first and the second CNTs (702, 704) away from each other.

On the other hand, when x becomes larger than $x_{pm}$, the electrical current decreases and, thus, Q increases, which in turn increases the electrostatic attracting force between the first and the second CNTs (702, 704). According to FIG. 3, the induced dipole-induced dipole attracting force also increases. Thus, the first and the second CNTs (702, 704) are pulled back toward each other.

The above-mentioned attracting and repulsive forces create a feedback mechanism that causes the oscillations of x and the electrical current shown in FIG. 4. This feedback mechanism can be viewed as a coupling between the electrostatic force captured in equations (2)-(5) above and a mechanical motion captured in Newton's equation of motion (6) below.

$$m\ddot{x} = \frac{-\partial}{\partial x}\left(\varphi_{mech} + \frac{Q^2}{2C}\right) - \gamma \dot{x} \qquad (6)$$

In equation (6), $\gamma$ is a damping constant and $\varphi_{mech}$ is the total mechanical potential between the first and the second CNTs (702, 704) that is calculated by equation (7) below.

$$\varphi_{mech} = U_{VdW} + U_{harm} \qquad (7)$$

In equation (7), $U_{VdW}$ is calculated by equation (1) above, and $U_{harm}$ is a harmonic potential that is calculated by equation (8) below.

$$U_{harm} = \alpha(x - x_{pm})^2 + u_0 \qquad (8)$$

In equation (8), $\alpha$ and $u_0$ are constants.

In accordance with one or more embodiments, the oscillations of x and the electrical current in FIG. 4 are for a case in which: $A = 3 \times 10^3$ eV·Å$^6$ and $B = 10^6$ eV·Å$^{12}$ in equation (1); $V = 0.6$ volts, $R_0 = 25.8$ kΩ, $R_1 = 1.9 \times R_0$, $\kappa = 5$ nm$^{-1}$, and $\alpha_c = 100$ nm$^2$ in equations (2)-(5); $\gamma = 10^{-9}$ ng·ns$^{-1}$ in equation (6); and $\alpha = 22.5$ eV·nm$^{-2}$, $u_0 = -8.5$ eV, and $x_{pm} = 0.3$ nm in equation (8).

In the example shown in FIG. 4, a period of the oscillations of x and the electrical current is about 2 ps. Thus, the oscillation frequency of the electrical current is about 0.5 THz.

According to one or more embodiments, by adjusting θ shown in FIG. 5, the ultra-high oscillation frequency of the CNT resonator can be tuned between tens of GHz to low THz regime. This frequency regime is much higher than oscillation frequency limit of conventional resonators such as FBARs, which typically have oscillation frequencies of less than 10 GHz.

Further, quality factor, which represents a resonator's efficiency, negatively depends on resistive energy dissipation in the resonator. Because CNTs are good conductors, the CNT resonator in accordance with one or more embodiments of the invention has higher quality factor than conventional resonators such as FBARs.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A carbon nanotube (CNT) resonator comprising:
   a first CNT having a first end and a second end both fixed to a substrate;
   a second CNT having a first end fixed to the substrate, wherein
   the second CNT creates a Van der Waals (VdW) bond with the first CNT where the second CNT overlaps the first CNT,
   a length of the VdW bond along a distance between the first and the second CNTs oscillates based on a DC voltage applied between the first end of the first CNT and the first end of the second CNT, and
   an electrical current passing through the first and the second CNTs using the VdW bond oscillates based on the oscillation of the length of the VdW bond.

2. The CNT resonator according to claim 1, wherein the second CNT functions as a cantilever.

3. The CNT resonator according to claim 1, wherein
   a frequency of the electrical current oscillation negatively depends on an angle formed between the first and the second CNTs, and
   the angle is in a range of 0°, in which the first and the second CNTs are parallel, to 90°, in which the first and the second CNTs are perpendicular with respect to each other.

4. The CNT resonator according to claim 1, wherein the first and the second CNTs are metallic.

5. The CNT resonator according to claim 1, wherein the first and the second CNTs are semiconducting.

6. The CNT resonator according to claim 1, wherein the first and the second CNTs are straight.

7. The CNT resonator according to claim 1, wherein the substrate is an insulator.

8. The CNT resonator according to claim 1, wherein the first and the second CNTs are single-wall CNTs.

* * * * *